(12) United States Patent
Mohr et al.

(10) Patent No.: US 10,756,777 B2
(45) Date of Patent: Aug. 25, 2020

(54) METHOD FOR DETECTING AN OPERATIONAL CONDITION OF A MULTI-CONDUCTOR CABLE

(71) Applicants: Charles L. Mohr, Richland, WA (US); Brandt C. Mohr, Richland, WA (US); Preston May, Richland, WA (US); Tony Cottam, Richland, WA (US); Erik Von Reis, Kennewick, WA (US); Christopher Mulkey, West Richland, WA (US); Ryan Sams, Kennewick, WA (US); Daniel Kenney, Richland, WA (US); William Rausch, Richland, WA (US); Kevin Dawes, Richland, WA (US)

(72) Inventors: Charles L. Mohr, Richland, WA (US); Brandt C. Mohr, Richland, WA (US); Preston May, Richland, WA (US); Tony Cottam, Richland, WA (US); Erik Von Reis, Kennewick, WA (US); Christopher Mulkey, West Richland, WA (US); Ryan Sams, Kennewick, WA (US); Daniel Kenney, Richland, WA (US); William Rausch, Richland, WA (US); Kevin Dawes, Richland, WA (US)

(73) Assignee: Mohr and Associates, Inc., Richland, WA (US)

( * ) Notice: Subject to any disclaimer, the term of this patent is extended or adjusted under 35 U.S.C. 154(b) by 160 days.

(21) Appl. No.: 15/941,336

(22) Filed: Mar. 30, 2018

(65) Prior Publication Data

US 2019/0305817 A1 Oct. 3, 2019

(51) Int. Cl.
*G01R 31/11* (2006.01)
*H04B 3/46* (2015.01)
(Continued)

(52) U.S. Cl.
CPC ............ *H04B 3/46* (2013.01); *G01R 27/06* (2013.01); *G01R 31/11* (2013.01); *G05F 1/10* (2013.01)

(58) Field of Classification Search
CPC .... G01R 31/11; G01R 31/025; G01R 31/085; G01R 31/086; G01R 31/088; G01R 31/021; G01R 31/024; G01R 31/1272
See application file for complete search history.

(56) References Cited

U.S. PATENT DOCUMENTS 4,165,482 A * 8/1979 Gale ............... G01R 31/11 324/523
4,538,103 A * 8/1985 Cappon ............ G01R 31/11 324/534

(Continued)

OTHER PUBLICATIONS

Notification of Transmittal of The International Search Report and the Written Opinion of The International Searching Authority, or the Declaration, PCT/US2019/022876, dated May 30, 2019.

*Primary Examiner* — Thang X Le
(74) *Attorney, Agent, or Firm* — Randall Danskin P.S.

(57) ABSTRACT

A method for detecting an operational condition of a multi-conductor cable is described, and which includes generating a first, single ended, time domain reflectometer signal which is introduced into a multi-conductor cable; processing the first, single ended, time domain reflectometer signal so as to generate a first, differential time domain reflectometer signal; supplying the first, differential time domain reflectometer signal to the multi-conductor cable; converting a reflected, differential time domain reflectometer signal into a second, single ended, time domain reflectometer signal; numerically and/or graphically analyzing the second, single ended, time domain reflectometer signal; and identifying, by the numerical and/or graphical analysis, an operational condition of the multi-conductor cable undergoing the testing.

22 Claims, 10 Drawing Sheets

(51) Int. Cl.
*G01R 27/06* (2006.01)
*G05F 1/10* (2006.01)

(56) References Cited

U.S. PATENT DOCUMENTS

| | | | | |
|---|---|---|---|---|
| 9,207,192 | B1* | 12/2015 | Focia | G01R 31/11 |
| 2006/0181283 | A1* | 8/2006 | Wajcer | H04B 3/46 |
| | | | | 324/539 |
| 2016/0216310 | A1* | 7/2016 | Schweitzer, III | H02H 1/0092 |
| 2018/0106849 | A1* | 4/2018 | Burek | H02H 7/265 |

* cited by examiner

METHOD FOR DETECTING AN OPERATIONAL CONDITION OF A MULTI-CONDUCTOR CABLE

TECHNICAL FIELD

The present invention relates to a method for detecting an operational condition of a multi-conductor or data transfer cable, and more specifically, to a methodology which facilitates the detection of operational defects that may occur, from time-to-time in a multi-conductor or data transfer cable including, but not limited to, locating electrical faults of various types along the length of the multi-conductor or data transfer cable; verifying the electrical termination of the same multi-conductor or data transfer cable; measuring the differential impedance along the multi-conductor or data transfer cable; and inspecting various electrical connections that might be made to the same multi-conductor or data transfer cable.

BACKGROUND OF THE INVENTION

For decades, time domain reflectometry has been used to measure the electrical reflections that result from an electrical signal traveling through a transmission environment of some kind. This environment could include, for example, a circuit board trace, a cable electrical connector, and the like. A time domain reflectometer instrument sends an electrical pulse through the medium, and then compares the returning reflections from the unknown media, such as a transmission wire, multi-conductor or data transfer cable, to those produced by a standard impedance transmission wire, multi-conductor or data transfer cable, for example. In normal practice, the time domain reflectometer which is selected, displays the voltage wave form that is reflected, and then returns when a fast step, incident signal is propagated down an electrical conductor. The resulting wave form is the combination of the incident step, and any electrical reflections which are generated when the incident step signal encounters impedance variations along the transmission line.

Impedance tolerances are part of the electrical specifications for many of today's complex digital system components. Still further, in some assemblies, such as highly advanced aircraft, that are used, for example, in military applications, it is necessary to locate possible malfunctions in such assemblies in a rapid manner in order to put an aircraft back into proper working condition. It has long been known that time domain reflectometry or (TDR) can be used to determine an amplitude of a reflected signal. Still further it has been known that the distance to a structure producing a reflecting impedance can also be determined from the time that it takes for an electrical pulse to return to the measuring instrument which has been selected.

While these aforementioned TDR devices, as utilized heretofore, have operated with varying degrees of success, problems persist with their usefulness in certain critical applications. One of the limitations of the aforementioned TDR devices is the perceived minimum system rise time for these prior art devices. It should be understood that the total rise time consists of the combined rise time of the driving pulse, and that of the oscilloscope, or other electrical sampling device which monitors the returning electrical reflections. Still further, these same prior art devices which have been utilized, heretofore, to determine and detect these reflected electrical signals have often been difficult to deploy outside a laboratory environment because of their size or complexity, or on the other hand, have repeatedly shown that they are less than accurate regarding detecting various electrical conditions in the transmission, multi-conductor or data transfer cable, which is being studied or tested. Further, these same prior art TDR devices, and the electrical traces they produce are often very difficult to interpret except for the most skilled technicians. Moreover, and while, in theory, the distance to an electrical problem that a multi-conductor or data transfer cable may have can be calculated or otherwise determined from a reflected electrical signal which is received from the multi-conductor or data transfer cable, this calculation has often-times proved more difficult to accurately calculate than what the available prior art information on this subject matter would tend to suggest.

Therefore, a method for detecting an operational condition of a multi-conductor or data transfer cable which avoids the shortcomings attendant with the prior art devices and methodology used heretofore, is the subject matter of the present invention.

SUMMARY OF THE INVENTION

A first aspect of the present invention relates to a method for detecting an operational condition of a multi-conductor or data transfer cable which includes providing an unknown multi-conductor or data transfer cable having a given length dimension, and which further encloses at least one pair of conductors; generating a first, single ended time domain reflectometer signal; processing the first, single ended time domain reflectometer signal so as to generate a first, differential time domain reflectometer signal, and supplying the first, differential time domain reflectometer signal to the at least one pair of conductors for travel along the length of the unknown multi-conductor or data transfer cable; receiving the first, differential time domain reflectometer signal which has traveled along the length of the at least one pair of conductors; converting the received first, differential time domain reflectometer signal which has traveled along the length of the at least one pair of conductors into a second, single ended, time domain reflectometer signal; numerically or graphically analyzing the received, second, single ended time domain reflectometer signal; and identifying, by means of the numerical or graphical analysis, an operational condition of the multi-conductor or data transfer cable.

Still another aspect of the present invention relates to a method for detecting an operational condition of a multi-conductor or data transfer cable which includes the steps of providing an unknown, multi-conductor or data transfer cable having a given length dimension, and which further encloses at least one pair of conductors; providing a high frequency balun coil, and electrically coupling the high frequency balun coil to the at least one pair of conductors; generating a first, single ended, time domain reflectometer signal with a time domain reflectometer, and supplying the first, single ended, time domain reflectometer signal to the high frequency balun coil; generating a first, differential time domain reflectometer signal with the high frequency balun coil which has previously received the first, single ended, time domain reflectometer signal, and supplying the first, differential time domain reflectometer signal to the at least one pair of conductors for travel along the length of the unknown multi-conductor or data transfer cable; receiving, with the high frequency balun coil, the first, differential time domain reflectometer signal which has previously traveled along the length of the at least one pair of conductors; converting, with the high frequency balun coil, the first differential time domain reflectometer signal which has traveled along the length of the at least one pair of conductors into a second, single ended, time domain reflectometer signal; supplying the second, single ended, time domain reflectometer signal to the time domain reflectometer for display; numerically or graphically analyzing the second, single ended, time domain reflectometer signal which was previously converted from the first, differential time domain reflectometer signal by the high frequency balun coil; and identifying, by means of the numerical or graphical analysis, an operational condition of the multi-conductor or data transfer cable.

Still another aspect of the present invention relates to a method for detecting an operational condition of a multi-conductor or data transfer cable which includes the steps of providing a non-faulted multi-conductor or data transfer cable having a given length dimension, and which further encloses two pairs of conductors; generating a first, differential time domain reflectometer signal, and selectively supplying the generated, first, differential time domain reflectometer signal to each of the pair of conductors which are enclosed within the non-faulted, multi-conductor or data transfer cable; converting the first, differential time domain reflectometer signal which has traveled along each of the pair of conductors which are enclosed within the non-faulted, multi-conductor or data transfer cable into a single ended, time domain reflectometer signal; providing an unknown multi-conductor or data transfer cable having a similar length dimension as the non-faulted, multi-conductor or data transfer cable, and which further encloses two pairs of conductors; generating a second, differential time domain reflectometer signal, and selectively supplying the generated second, differential time domain reflectometer signal to each of the pair of conductors which are enclosed within the unknown multi-conductor or data transfer cable; converting the second, differential time domain reflectometer signal which has traveled along each of the pair of conductors which are enclosed within the unknown multi-conductor or data transfer cable into another single ended, time domain reflectometer signal; numerically and/or graphically analyzing the respective single ended, time domain reflectometer signals which were obtained from the respective two pairs of conductors, and which are each enclosed within the non-faulted, and unknown multi-conductor of data transfer cables, respectively; and identifying an operational condition of the unknown multi-conductor of data transfer cable by conducting the numerical and/or graphical analysis of the respective single ended, time domain reflectometer signals which have been obtained.

These and other aspects of the present invention will become readily apparent in the paragraphs that follow.

BRIEF DESCRIPTION OF THE DRAWINGS

Preferred embodiments of the present methodology described below with reference to the following accompany drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
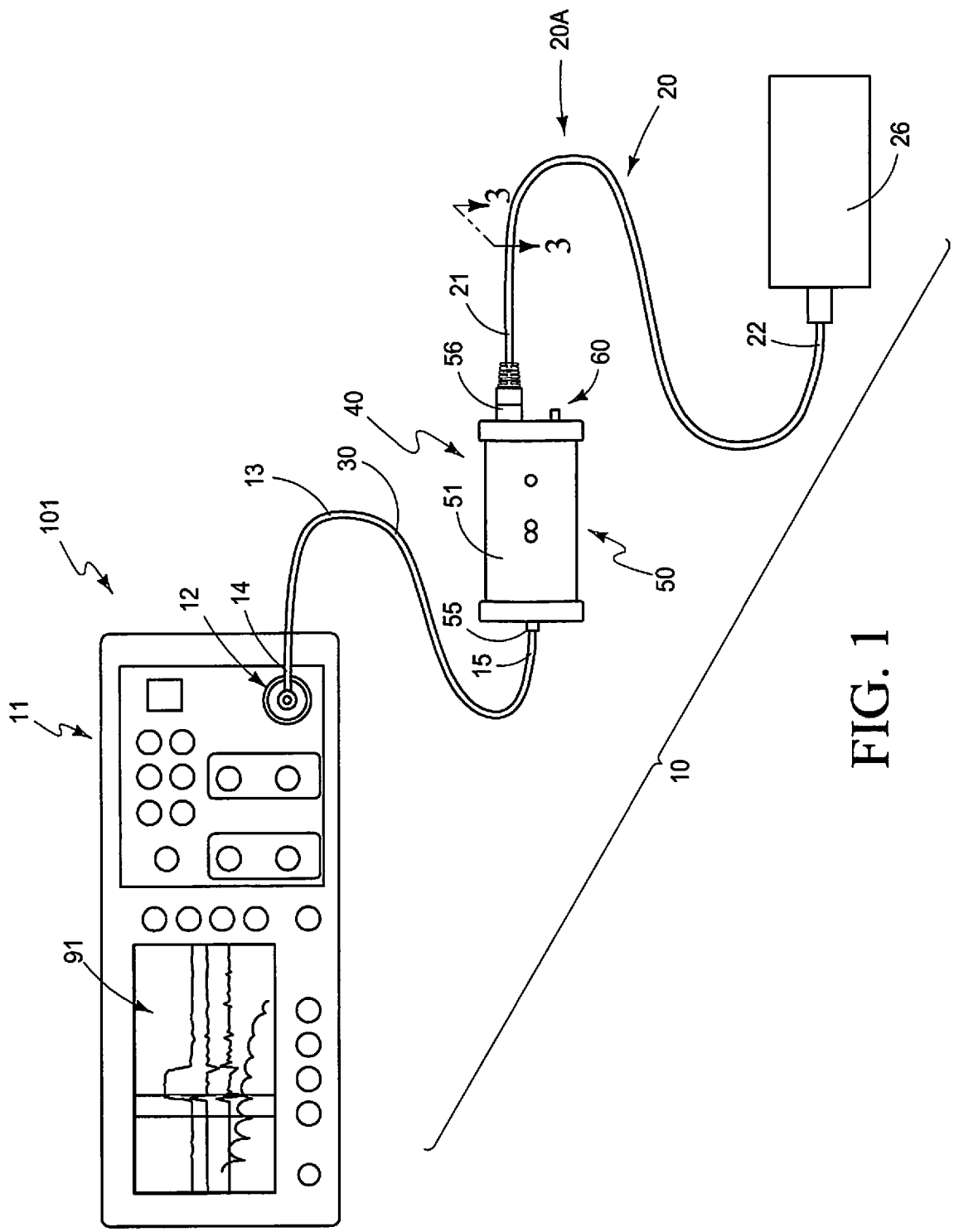
FIG. 1 is a greatly simplified, schematic view of one possible arrangement for practicing the methodology of the present invention.

The method for detecting an operational condition of a multi-conductor or data transfer cable is generally indicated by the numeral 10, in FIG. 1, and following. As seen in the drawings, the present invention includes a step of providing a single channel, metallic, time domain reflectometer 11, and which is operable, when selectively energized, to provide a first, single ended, time domain reflectometer signal which will be utilized in further steps of the present methodology, as described, below. A suitable time domain reflectometer, as mentioned, above, can be commercially purchased under the trademark MOHR CT100B Cable Tester™. The time domain reflectometer 11 as illustrated in FIG. 1 includes a test port 12, and which will electrically couple with a test coupling cable which is generally indicated by the numeral 13. The test cable 13, has a first end 14 which releasably, electrically couples with the test port 12, and an opposite, second end 15. The aforementioned time domain reflectometer 11 operates in a conventional manner well understood by those skilled in the art to produce the single ended, time domain reflectometer signal as discussed, below.

Figure 3:
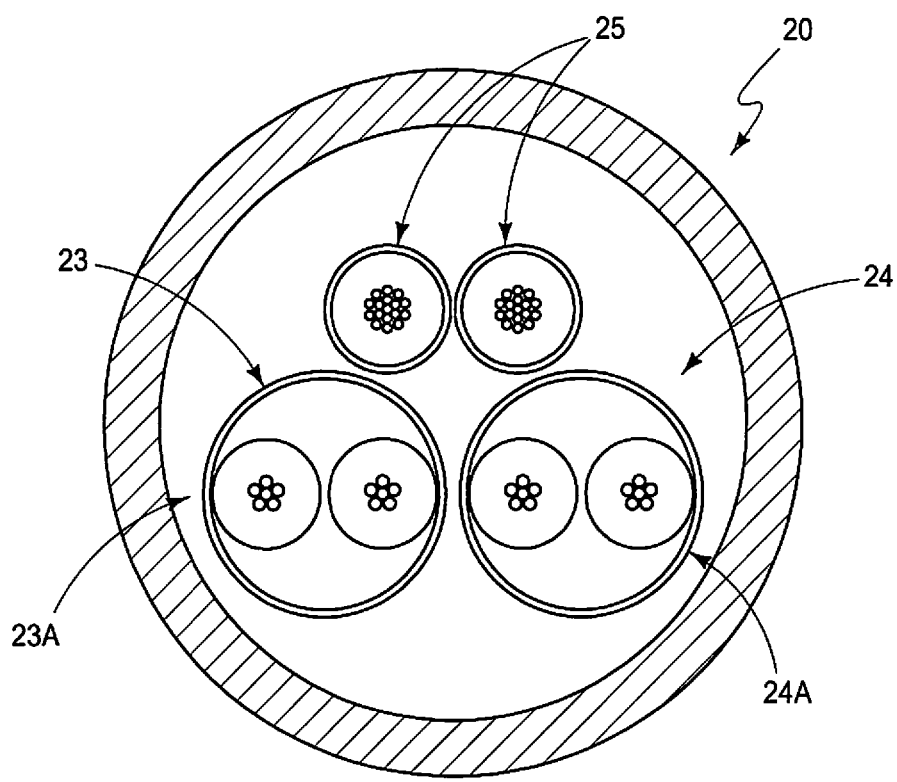
FIG. 3 is a greatly enlarged, transverse, vertical, sectional view taken from a position along line 3-3 of FIG. 1.

The methodology 10 of the present invention includes a first step of providing an unknown multi-conductor or data transfer cable 20 (FIG. 1), having a given length dimension, and which further encloses at least one pair of conductors, as will be discussed in greater detail, below. The multi-conductor or data transfer cable 20 has a first end 21, and which is coupled in electrical signal receiving relation relative to the prior art, single channel, metal, time domain reflectometer 11, as discussed, above. Still further, the unknown multi-conductor of data transfer cable 20 has a second end 22, and which terminates at an electrical appliance or other device 26, such as a circuit card which might be incorporated into a digital device, not shown. The electrical appliance, or device 26, is located in electrical receiving relation relative to both the second end 22, and the time domain reflectometer 11. Referring now to FIG. 3, the unknown multi-conductor or data transfer cable 20 encloses at least one pair of conductors, and which are generally indicated by the numeral 23. In another possible form of the invention, a second pair of conductors 24 may be included (FIG. 3). It is conceivable that three or more pairs of conductors could be enclosed within the multi-conductor or data transfer cable 20. As seen in FIG. 3, and in some forms of the invention, electrical power conduits 25 may also be enclosed within the unknown multi-conductor or data transfer cable 20. One example of a commercially available data transfer cable of the type described, above, can be commercially purchased under the trademark, FireWire 800™. The aforementioned product is also identified in the commercial market as an IEEE 1394b data transfer cable.

Figure 2:
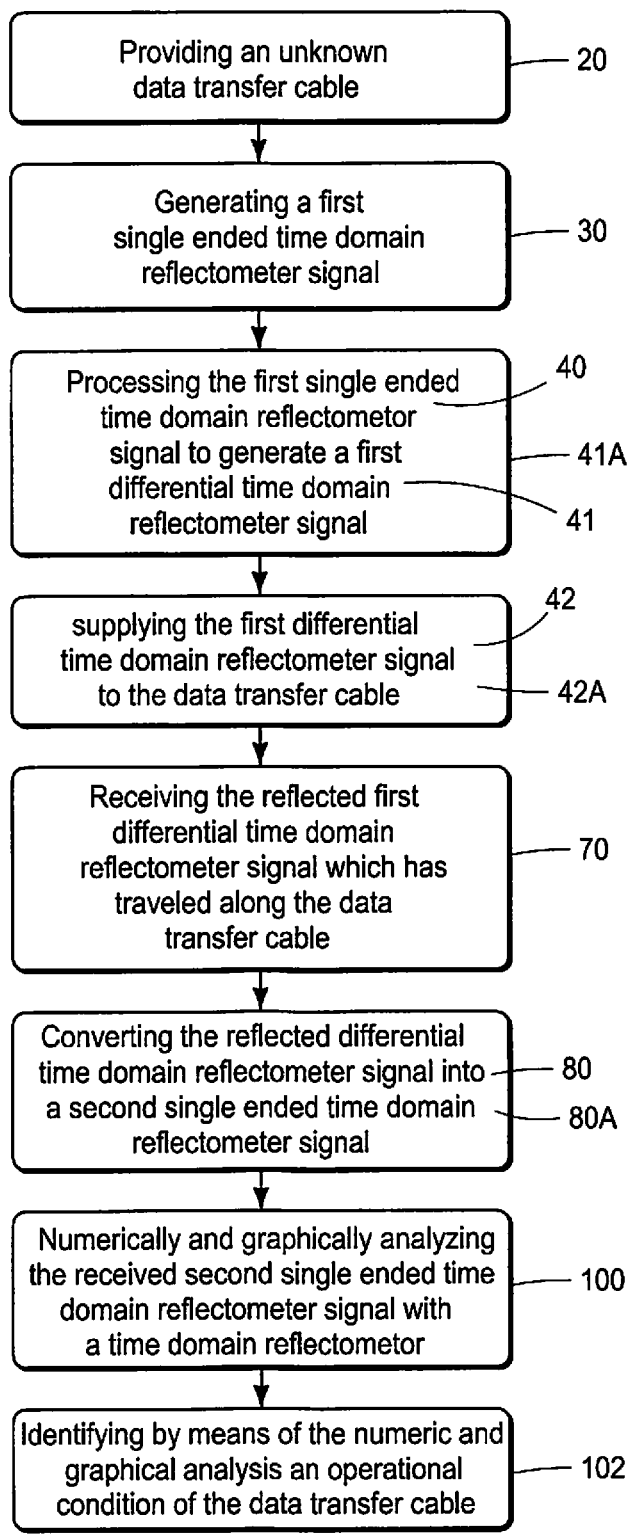
FIG. 2 is a schematic flowsheet showing the steps in one form of the methodology of the present invention.

The current methodology 10 includes, in one possible form of the invention, another step of generating a first, single ended, time domain reflectometer signal 30 by selectively energizing the time domain reflectometer 11 (FIGS. 1 and 2). In this regard the step of generating a first, single ended, time domain reflectometer signal 30 further includes a step of delivering the generated, first, single ended, time domain reflectometer signal to the test port 12. The generated, first, single ended signal 30 then travels along the coupling cable 13, from the first end 14, to the second end 15. The method 10 of the present invention further includes another step 40 of processing the first, single ended, time domain reflectometer signal so as to generate a first, differential, time domain reflectometer signal 41, and then supplying the first differential time domain reflectometer signal 41, which was generated, to at least one of the pair of conductors 23 or 24, respectively, for travel along the given length of the unknown multi-conductor or data transfer cable 20.

Figure 4:
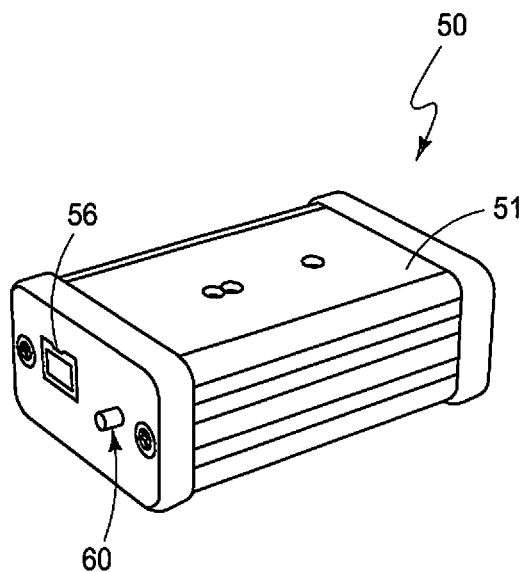
FIG. 4 is an isometric, side elevation view of an assembly which can implement several steps in the methodology of the present invention.
Figure 5:
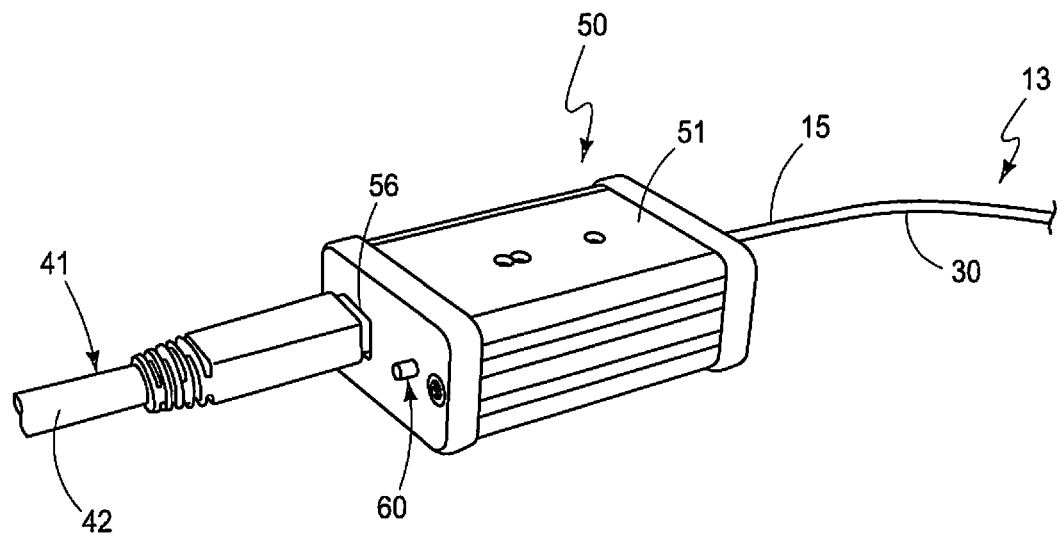
FIG. 5 is a second, isometric view of the assembly which can implement several steps of the methodology of the present invention, and which is further illustrated in a typical operational configuration.

Referring now to FIGS. 1, 4, 5 and 8, the method 10 of the present invention further includes a step of providing a signal processing assembly 50, and which is further enclosed within a housing 51. The housing 51, as illustrated in FIGS. 4 and 5, respectively, defines an internal cavity 52 which encloses a first high frequency balun coil 53, and a second high frequency balun coil which is generally indicated by the numeral 54. The first and second balun coils are non-standard. The respective balun coils 53, and 54 each have a primary side electrical input, and a pair of secondary side electrical outputs, not shown. Still further the signal processing assembly 50 includes a first female, electrical coupler 55, which matingly couples with the coupling data cable 13. As earlier discussed, this data cable 13 is electrically coupled with the test port 12 of the time domain reflectometer 11; and a second, female electrical coupler 56 is provided, and which is further electrically coupled to the first end 21 of the unknown data transfer cable 20. Still further, the signal processing assembly 50 includes a two-position electrical switch 60 which is electrically coupled with the several electrical conductors 61 which extend to, and are electrically coupled with, each of the first and second electrical female couplers 55 and 56, respectively, and with the first and second baluns 53 and 54, respectively. The electrical switch, which can be actuated manually (FIG. 8), or digitally by means of a digital communication cable, not shown, has a first operational position 62, (FIG. 8) which allows the generated, first, single ended, time domain reflectometer signal 30 to be delivered to the first balun coil 53; and a second, operational position 63, which allows the second, electrical balun coil 64 to be coupled in signal receiving relation relative to the generated first, single ended, time domain reflectometer signal 30. It should also be understood that when the first, single ended, time domain reflectometer signal 30 is delivered to the first balun coil 53, the same balun coil 53 is operable to convert the first, single ended, time domain reflectometer signal, and then generate a resulting, first, differential, time domain reflectometer signal output 41, and which is selectively supplied to one of the two, discrete pairs of conductors 23 or 24, respectively. Suitable baluns, as described, can be commercially secured from a company named Coilcraft and which is located in Cary Ill. Alternatively, when the first, single ended, time domain reflectometer signal 30 is delivered to the second balun coil 54, the second balun coil 54 converts the first, single ended time domain reflectometer signal 30, and then produces a first, differential time domain reflectometer signal output 41 which is then delivered to the other of the two pairs of conductors 23 and 24, respectively. Thus by selectively actuating the electrical switch 60, (either physically or by digital means) the differential signal can be selectively delivered to one of the pair of conductors 23, or 24, but not to both pairs of conductors.

The present invention 10, and more specifically the signal processing assembly 50, as described, above, is selectively energized by an electrical power source, not shown in the drawings, so that the method features of present invention could be easily understood. In the form of the invention as seen in FIG. 1, a rechargeable battery is enclosed within the housing 51. Further this same battery is rechargeable, and the signal processing assembly would further include an electrical circuit (not shown) to facilitate the recharging of the enclosed battery. In one possible form of the invention the recharging of the enclosed battery would be facilitated by a simple USB cable (not shown). Of course, an outside power source could also be coupled to the signal processing assembly 50 and achieve the same operational effect.

The method 10 for detecting an operational condition of a multi-conductor or data transfer cable 20 includes another step 70 of receiving the first differential time domain reflectometer signal 41 which has traveled along the length of the at least one pair of conductors 23 or 24, from the first end 21, and is then electronically reflected from the second end 22. In this regard, and as earlier discussed, the present method 10 includes a step of providing a high frequency balun coil 53 or 54, respectively, and electrically coupling the respective high frequency balun coils to the respective pairs of conductors 23 and 24, respectively. The method 10 includes another step of placing the respective balun coils in signal receiving relation relative to the first, single ended, time domain reflectometer signal 40. Following the step 70 of receiving the first differential time domain reflectometer signal which has traveled along the length of one of the pairs of conductors 23 and 24, respectively, the method 10 includes yet another step of converting 80, the received differential time domain reflectometer signals which have traveled along the respective pairs of conductors or conduits 23 or 24, into a second, single ended, time domain reflectometer signal 80. The method 10 of the present invention includes yet another step 90 of supplying the second, single ended, time domain reflectometer signal 80 to the time domain reflectometer 11, as earlier described. The method 10 then includes yet another step 91 of displaying the second, single ended, time domain reflectometer signal 80 by means of the time domain reflectometer 11 (FIG. 1). As seen in the drawings (FIG. 1) the method 10 includes still another step 101 of receiving, and then electronically storing for later use, the second, single ended, time domain reflectometer signals 80, with the time domain reflectometer 11. Still further, the method 10 includes another step 102 (FIG. 2) of utilizing the previously electronically stored, second, single ended time domain reflectometer signal 80 so as to identify at least one operational condition of the multi-conductor or data transfer cable 20 or 20A. It should be understood that the method 10 includes still another step of numerically and/or graphically analyzing 100 the received second, single ended, time domain reflectometer signal 80 in order to quantify the nature and location of the operational condition of the multi-conductor of data transfer cable 20 or 20A (as discussed hereinafter) which was identified by the aforementioned numerical and/or graphical analysis.

Figure 11:
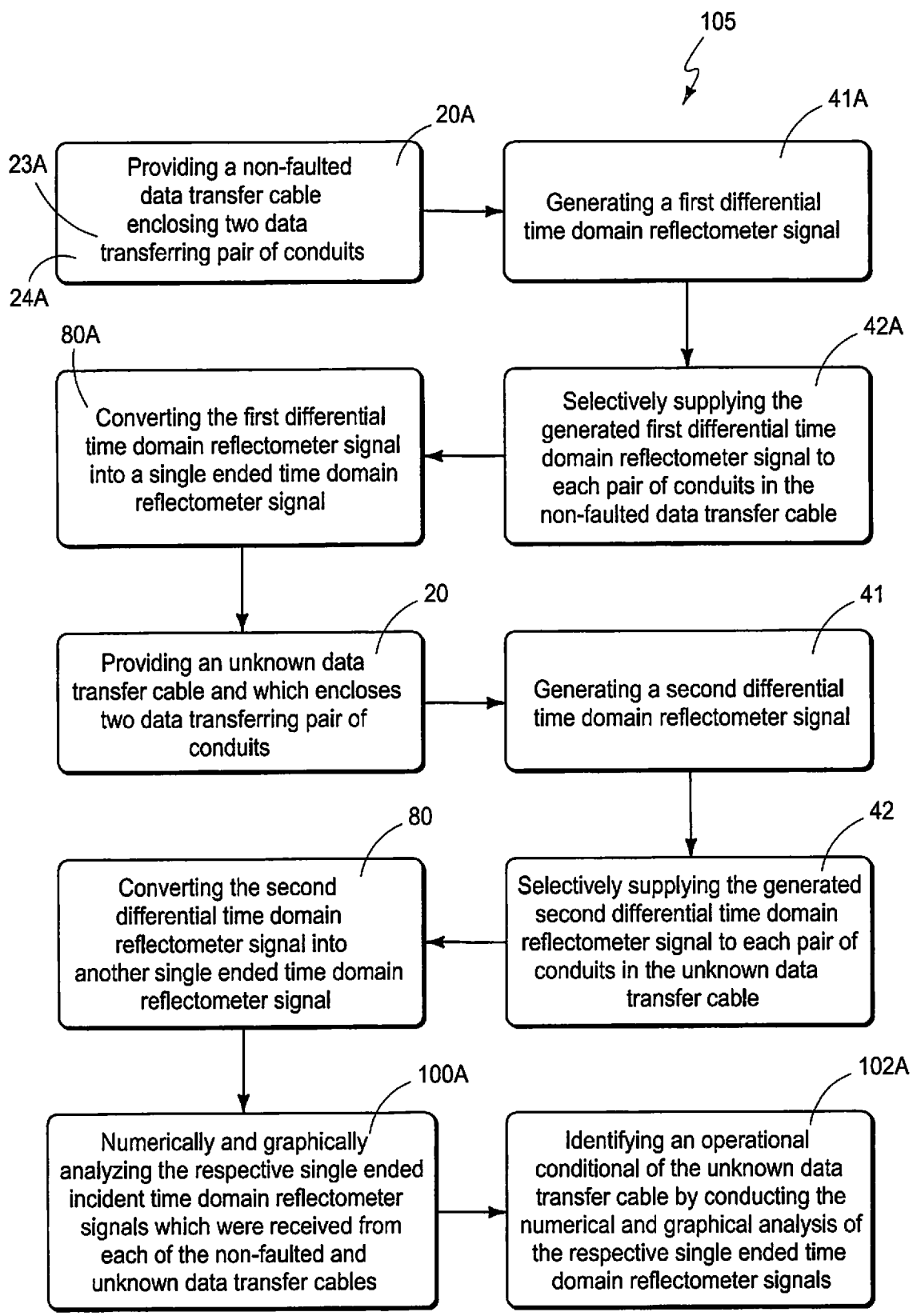
FIG. 11 is a schematic flow sheet showing a series of method steps in one possible form of the methodology of the present invention.

Referring now to FIG. 11, a second form 105 of the invention 10 is depicted in this schematic flow diagram. In this form of the invention 10 the method includes a first step of providing a non-faulted, multi-conductor or data transfer cable 20A and which encloses two pairs of conduits or conductors 23A and 24A, respectively, and which are similar in construction to that as seen in FIG. 3. It should be understood that a non-faulted, multi-conductor or data transfer cable is one in which previous operational measurements or performance parameters, and/or metrics, have been made or established for of the multi-conductor or data transfer cable, and it has been ascertained that the multi-conductor or data transfer cable is functioning according to its understood or previously agreed-upon technical specifications. The method 10 includes another step indicated by the alphanumeric designator 41A, and which includes generating a first differential time domain reflectometer signal by means of the time domain reflectometer 11, as seen in FIG. 1. The second form of the invention 105, further includes another step 41A, of selectively supplying the generated, first differential time reflectometer signal to each pair of conductors or conduits in the non-faulted, multi-conductor or data transfer cable 20A. The method 10 includes still another step 80A, which comprises another step of converting the first differential time domain reflectometer signal 42A into a single ended, time domain reflectometer signal. This second form of the invention includes yet another step 20, of providing an unknown multi-conductor or data transfer cable, and which includes two pairs of conductors or conduits 23 and 24, as seen in FIG. 3. The method includes still another step of generating a second differential time domain reflectometer signal 41, as earlier discussed. This form of the invention includes yet another step 42 of selectively supplying the generated second, differential time domain reflectometer signal to each pair of conductors or conduits 23 or 24, in the unknown multi-conductor or data transfer cable 20. The method 10 includes still another step 80 of converting the second, differential time domain reflectometer signal into another, single ended, time domain reflectometer signal. Yet further, the method 10 includes another step 100 of numerically, and/or graphically analyzing the respective, single ended, time domain reflectometer signals which were received from each of the non-faulted 20A, and unknown multi-conductor or data transfer cables 20, respectively. Finally, this form of the methodology 10 includes another step 102A of identifying an operational condition of the unknown multi-conductor or data transfer cable 20A by conducting a numerical and/or graphical analysis of the respective, single ended, time domain reflectometer signals that have been received by the time domain reflectometer 11.

In the methodology 10 of the present invention, the step 100 of identifying by means of the numerical and/or graphical analysis, an operational condition of the multi-conductor or data transfer cable 20 or 20A further includes a step 110 (FIG. 7) of identifying, and locating one or more electrical faults or undesirable operational conditions along the length of the multi-conductor or data transfer cable 20 or 20A; identifying the location, and operational condition of the one or more electrical couplings 121 which have been made to the multi-conductor or data transfer cable; identifying the operational quality 122, 123, and 124 of the multi-conductor or data transfer cable, and all couplers 121, which are electrically joined to the multi-conductor or data transfer cable; and/or verifying an electrical termination 124 of each of the pairs of conductors or conduits 23 or 24, respectively.

Figure 6:
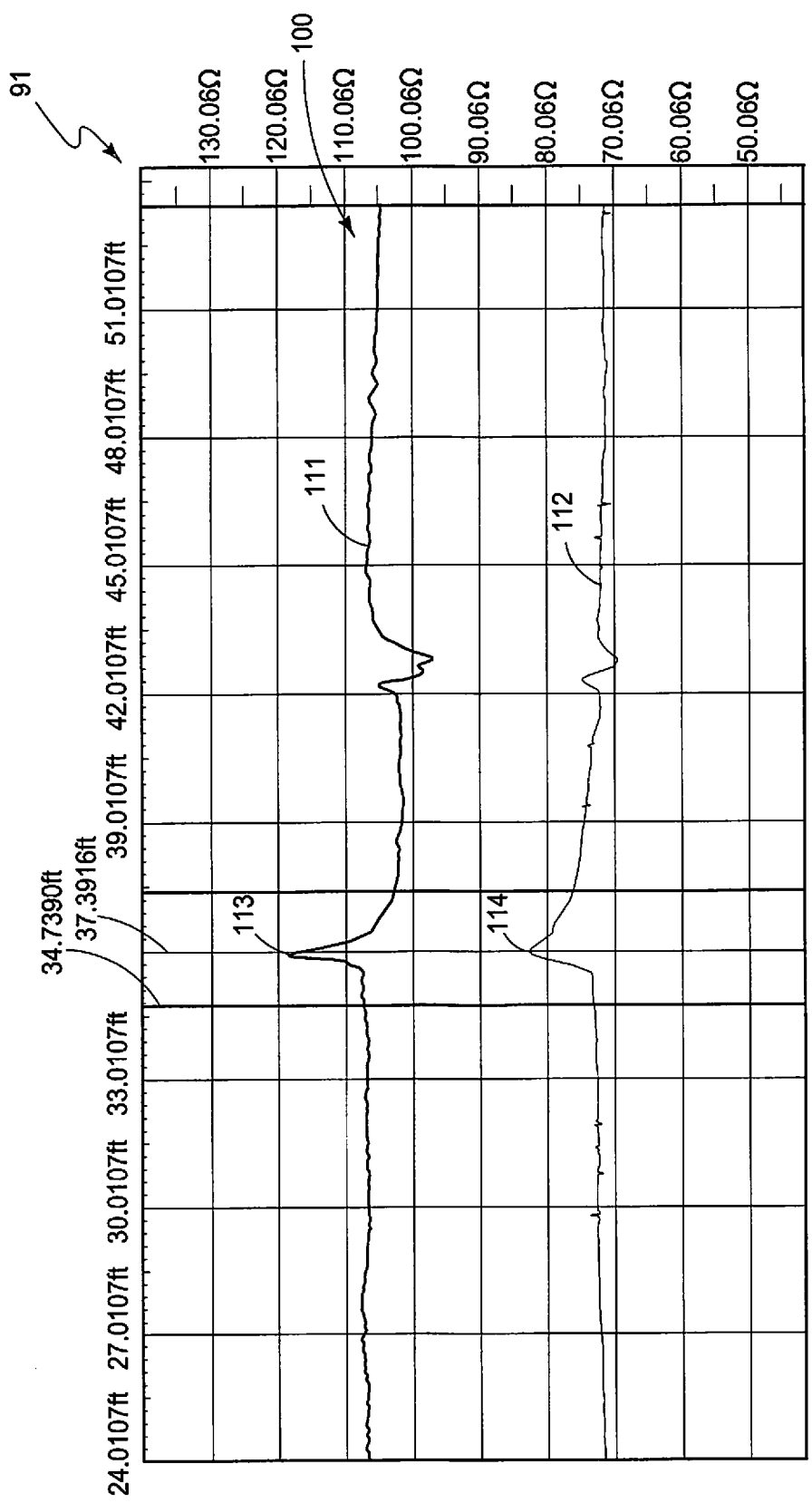
FIG. 6 is a graphical depiction of two signal traces which were secured from a multi-conductor or data transfer cable, and which shows a comparison between a signal trace which is derived from a differential signal, and a signal trace which was derived from a single-ended signal.

Referring now to FIG. 6, and as discussed earlier in this patent application, signal traces can be prepared to show time domain reflectometer signals which are supplied to the conductors 23 and 24, respectively. FIG. 6 displays two typical signal traces prepared by a time domain reflectometer 11, as seen in FIG. 1. In this regard the signal trace 111 is prepared using the methodology 10 of the present invention; and the signal trace labeled 112 is prepared from a time domain reflectometer which generates a single ended signal which is supplied to the same multi conductor or data transfer cable. One should notice, even upon a casual inspection of the signal trace 112, that there are grossly inaccurate impedance measurements generated when one solely employs a single ended, time domain reflectometer signal to generate the signal trace, when this same signal trace is compared to the signal trace 111 which is formed from a differential time domain reflectometer signal. FIG. 6 clearly shows impedance measurements which are significantly different between these two signal traces. Moreover the signal trace 112, which is formed of a single ended signal displays an elongated tail after the connection is made between the cables, and extraneous noise is also seen in the signal trace. What one skilled in the art garners from this comparative analysis is that the present methodology 10, as depicted in the signal trace 111 produces much more desirable electrical measurements of the operational condition of the multi-conductor or data transfer cable 20 or 20A being reviewed of tested. In FIG. 6, the peak in each of the signal traces 111 and 112, respectively, and which is labeled 113 and 114, respectively, indicates the connection point between a 30 foot multi-conductor or data transfer cable, and an attached 6 foot multi-conductor or data transfer cable (FireWire™). Particular note should be made of the precise peak 113 as found in the differential trace 111, which is prepared using the disclosed methodology, as compared to the peak 114 as found in the single-ended incident signal trace 112.

What should be learned from a study of FIG. 6, and understood from the earlier discussion of the prior art, is that differential time domain reflectometer signals provided to a multi-conductor or data transfer cable provide a very desirable signal trace which enhances the ability of a user to identify electrical faults along the multi-conductor or data transfer cable. However, and in view of the known shortcomings of the prior art devices that can generate such differential signals (size, complexity, difficulty in operation, and/cost, to name but a few), these prior art devices have not found wide spread usage except in limited operational environments. On the other hand, the methodology 10, of the present invention allows a user to employ a time domain reflectometer 11, as earlier described, and which is light weight, less expensive, and easier to operate, and which, in combination with the signal processing assembly 50, as earlier described, generates a differential time domain reflectometer signal from a single ended time domain reflectometer signal, and which is then supplied to a multi-conductor or data transfer cable 20 or 20A. Upon reflection from the distal end of the multi-conductor or data transfer cable being tested, the differential time domain reflectometer signal is then converted by the signal processing assembly 50 back into a single ended, time domain reflectometer signal, and which is then supplied back to the time domain reflectometer 11. Once received by the time domain reflectometer, the single ended, time domain reflectometer signal undergoes a numerical and/graphical analysis to determine an operational condition of the multi-conductor of data transfer cable.

Figure 7:
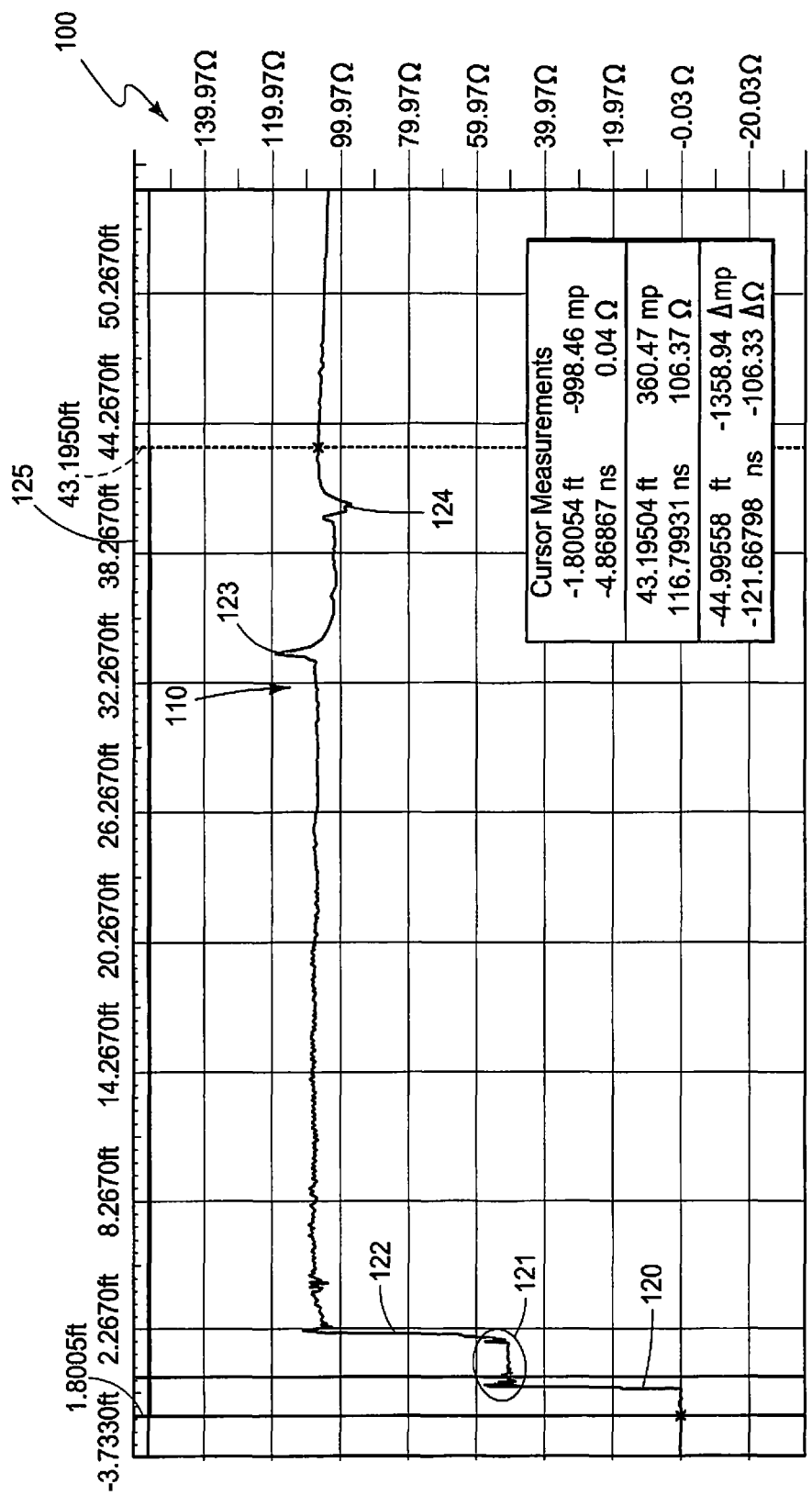
FIG. 7 is a graphical depiction of a typical signal trace which is secured from a time domain reflectometer, and which shows a typical time domain reflectometer signal trace of a 30 ft. multi-conductor or data transfer cable which is then electrically coupled to an adjacent 6 foot multi-conductor or data transfer cable.
Figure 8:
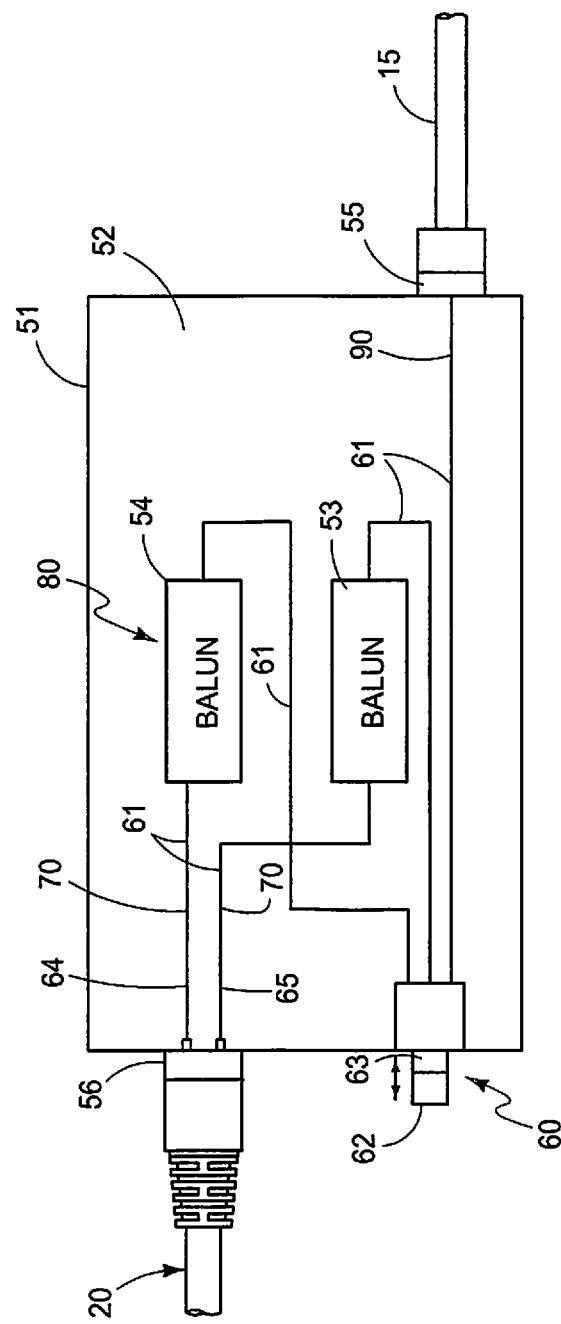
FIG. 8 is a very greatly simplified, schematic view, of an assembly which is utilized to implement several steps in one form of the methodology of the present invention.
Figure 9:
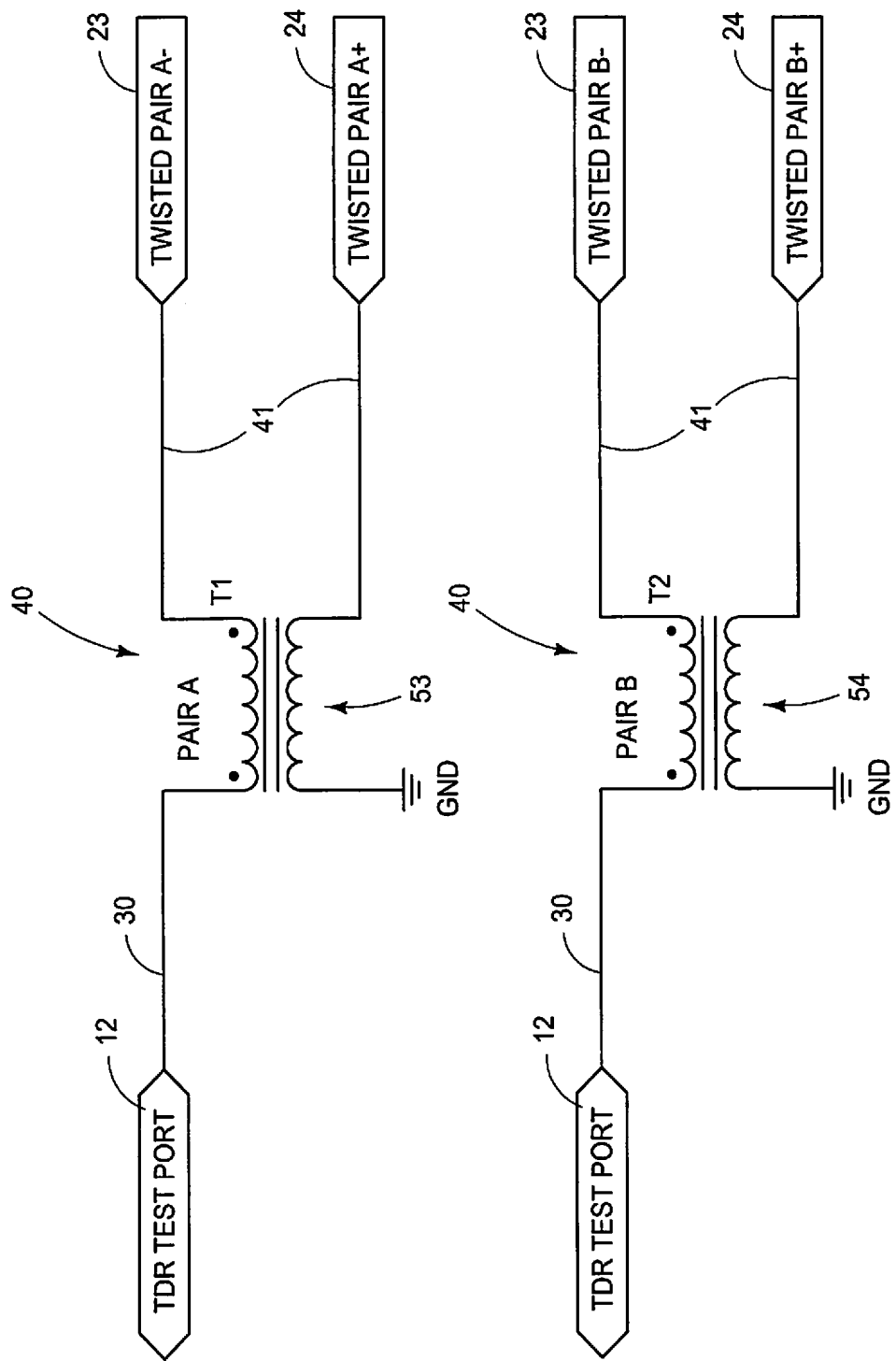
FIG. 9 is a greatly simplified, schematic representation of a portion of the assembly as seen in FIG. 8.

Referring now to FIG. 7, the step 110 of identifying and locating one or more possible electrical faults or other electrical couplers along the length of the multi-conductor or data transfer cable 20 or 20A, as earlier discussed, can again be demonstrated. FIG. 7 depicts a time domain reflectometer signal trace of a complete multi-conductor or data transfer cable 20 which is 30 feet long, and which further is electrically coupled to a 6 foot long FireWire™ multi-conductor cable (FIG. 3), as earlier described. Referring now to the details of the signal trace as illustrated in FIG. 7, it will be understood that the initial, single ended, time domain reflectometer pulse, is indicated by that section of the signal trace which is labeled 120. The region of the signal trace as seen in FIG. 7 which identifies the signal processing assembly 50, as earlier disclosed, is labeled by the numeral 121. As earlier discussed the single ended time domain reflectometer signal produced by the time domain reflectometer 11 is then converted by the signal processing assembly 50 from a single ended pulse, into a differential pulse 41 by means of the operation of the electrical baluns 53, and 54, as earlier described. Referring still to FIG. 7, the region of the signal trace 110 which represents the electrical junction of the 30 foot portion of the multi-conductor cable, with the 6 foot section of multi-conductor cable (FireWire™) is indicated by the region labeled 123. The region of the signal trace 110, as seen in FIG. 7, and which relates to the electrical termination at the end of the 6 foot multi-conductor cable section is labeled by the numeral 124. As seen in FIG. 7, it will be noted that the top horizontal axis which is labeled 125 represents the horizontal or linear location of the particular features, just described, beginning at the start, or the first end 21 of the multi-conductor or data transfer cable 20, being tested. As will be recognized, the locations 121 of the signal processing assembly, and junction 123 of the respective multi-conductor cables, as well as the electrical termination 124, etc. can be easily calculated, and then displayed utilizing the time domain reflectometer 11, so that a user of the present methodology 10 can quickly consider the operational condition of the multi-conductor or data transfer cable being tested, and can then readily physically locate any operational anomaly along the multi-conductor cable by its horizontal or linear distance as measured along the multi-conductor cable 20 or 20A being tested.

Figure 10:
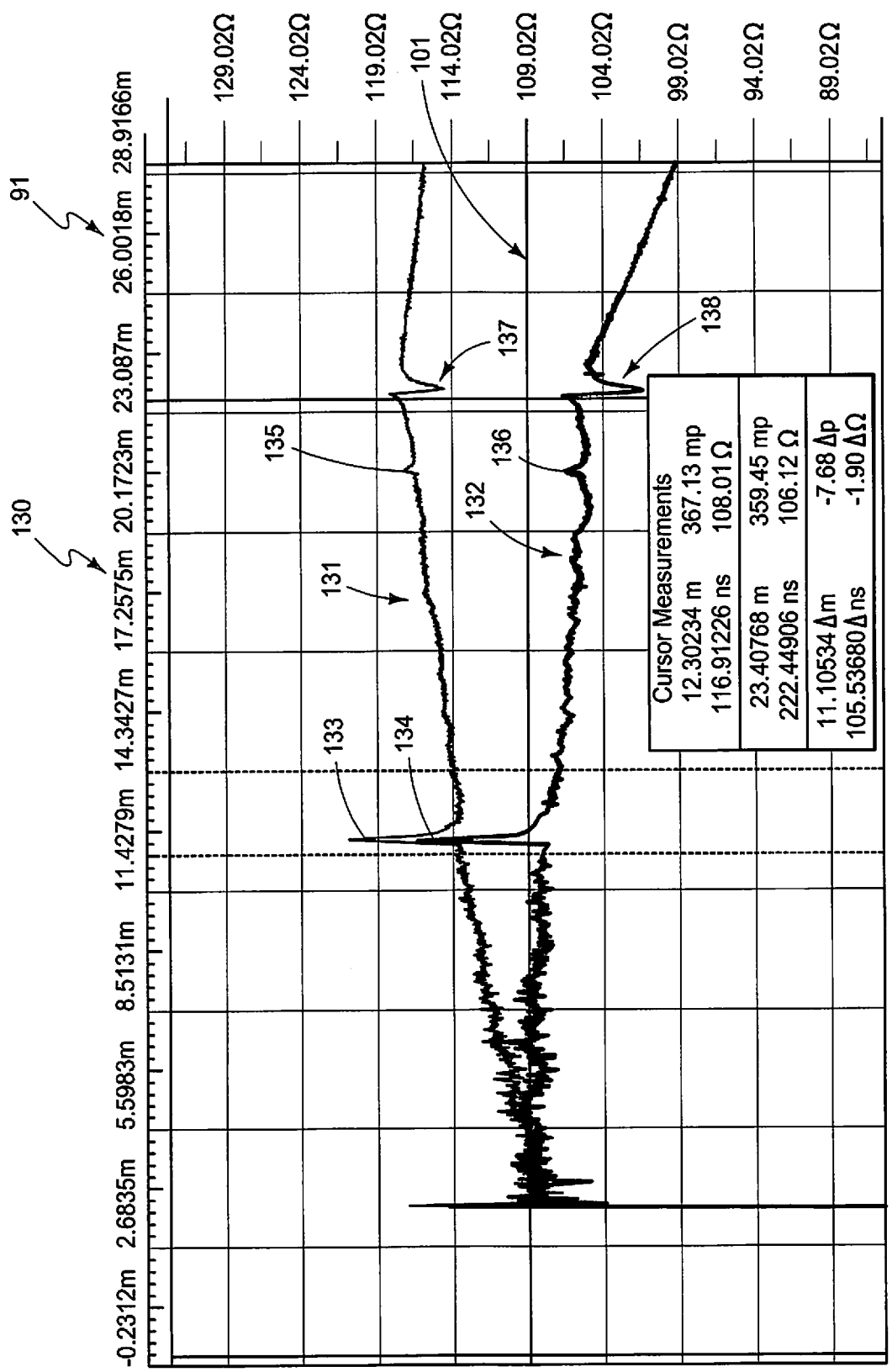
FIG. 10 is a time domain reflectometry signal trace which displays the differences between a time domain reflectometer signal trace which is formed from a differential signal provided by a prior art device, and which solely provides a differential signal; and the corresponding signal trace formed by the methodology of the present invention.

Referring now to FIG. 10, the comparative signal traces of a differential signal trace formed from a prior art TDR device (not shown) is contrasted with a signal trace which is generated by the present methodology 10 so as to demonstrate the many advantages of utilizing the present methodology. In particular, it will be noted from a study of FIG. 10, that a differential signal trace 131 is illustrated, and which is produced by a prior art time domain reflectometer (not shown), and which solely generates a differential signal. As earlier discussed, the prior art has numerous shortcomings such as a high purchase cost, difficulty in utilizing such prior art devices, and the like. In contrast, the signal trace prepared by the methodology 10 of the present invention is shown below the signal trace 131, and is labeled 132. As can be seen from comparing these two signal traces (131 and 132) the overall shape of each signal trace is surprisingly similar. More specifically, the amplitude and peaks of the specific signal traces are very similar. This is very much in contrast to that seen in FIG. 6. For example, it should be recognized that the impedance values as displayed in FIG. 10 are very close. On the other hand the impedance measurements as seen in FIG. 6, are much wider apart. The respective peaks 133 and 134 as seen in FIG. 10 indicate the location of the electrical union of two 30 foot multi-conductor cables (FireWire™). A casual inspection of these peaks will demonstrate that the present methodology 10 provides a signal trace which is not only strikingly similar to that provided by the prior art device 131, but which further provides information which is very similar to the same operational information provided for the multi-conductor cable 20, and which is derived from the prior art devices. Each of the signal traces 131 and 132, respectively, further show individual peaks labeled 135 and 136, and which further represent the electrical connection between the 30 foot multi-conductor cable (FireWire™), and an adjacent 6 foot multi-conductor (FireWire™) cable which is being utilized to demonstrate the usefulness of the present invention. Again, the termination of the 6 foot FireWire™ cable is indicated by the regions 137 and 138 of the signal traces 131 and 132, respectively. Again, please note the precise locations of the respective peaks, as illustrated. It has been determined that the information generated by the second signal trace 132 is an accurate representation of the operational performance of the multi-conductor or data transfer cable 20 being tested. However this signal trace is being provided by, or generated using a time domain reflectometer 11, which solely generates a single ended, time domain reflectometer signal. Further the time domain reflectometer 11 as earlier described is light weight, inexpensive, and easier to use than the prior art devices, and further produces a differential time domain reflectometer signal by means of a signal processing assembly 50 which is utilized in combination with the time domain reflectometer 11. The signal trace which is generated using the currently disclosed methodology is as accurate as that produced by the prior art device, but further simultaneously avoids all the shortcomings of the prior art devices discussed, above, and allows the diagnosing or trouble-shooting of various electrical systems in a manner not possible using the prior art devices.

Operation

The operation of the described embodiment of the present invention 10 is believed to be readily apparent, and is briefly summarized at this point. In its broadest aspect the present invention relates to a method 10 for detecting an operational condition of a multi-conductor or data transfer cable 20, and which includes the steps of providing an unknown multi-conductor or data transfer cable 20, having a given length dimension, and which further encloses at least one multi-conductor or data transferring pair of conduits 23 or 24, respectively. The method includes another step 30 of generating a first single ended, time domain reflectometer signal. Still further the present method includes a step 40 of processing the first, single ended, time domain reflectometer signal so as to generate 41 a first differential time domain reflectometer signal, and supplying 42 the first differential time domain reflectometer signal to at least one the multi-conductor or data transferring pair of conduits 23 or 24, for travel along the length of the unknown multi-conductor or data transfer cable 20. The method includes another step 70 of receiving the first differential time domain reflectometer signal 41 which has traveled along the length of the at least one multi-conductor or data transferring pair of conduits 23 or 24, respectively. Still further, the method 10 includes another step 80 of converting the received first, differential time domain reflectometer signal 41 which has traveled along the length of the at least one multi-conductor or data transferring cable 23 or 24, into a second, single ended time domain reflectometer signal. Yet further, the method 10 of the present invention includes another step 100 of numerically analyzing the received second, single ended, time domain reflectometer signal 80. Finally, the method, in its broadest aspect, includes a step 102 of identifying, by means of the numerical and/or graphical analysis 100, an operational condition of the multi-condudata transfer cable 20.

Another aspect of the present invention relates to a method 10 for detecting an operational condition of a multi-conductor or data transfer cable 20, and which includes a first step of providing an unknown multi-conductor or data transfer cable 20 having a given length dimension, and which further encloses at least one multi-conductor or data transferring pair of conduits 23 or 24, respectively. The method 10 includes another step of providing a high frequency balun coil 53 or 54, and electrically coupling at least one of the high frequency balun coils to the multi-conductor or data transferring pair of conduits 23 or 24. The method 10 includes another step 30 of generating a first, single ended, time domain reflectometer signal with a metallic, time domain reflectometer 11, and supplying 42 the first, single ended, time domain reflectometer signal to at least one of the high frequency balun coil 53 or 54. The method 10 of the present invention further includes another step 41 of generating a first, differential time domain reflectometer signal with at least one of the high frequency balun coil 53 or 54, and which has previously received the first, single ended, time domain reflectometer signal 30, and then supplying 42 the first differential time domain reflectometer signal 41 to at least one of the multi-conductor or data transferring pair of conduits 23 or 24, for travel along the length of the unknown multi-conductor or data transfer cable 20. The method 10 includes another step 70 of receiving, with the high frequency balun coil 53 or 54, the first, differential, time domain reflectometer signal 41, and which has previously traveled along the length of at least one of the multi-conductor or data transferring pair of conduits 20. The method 10 further includes another step 80 of converting, with at least one of the high frequency balun coil 53 and 54, the first, differential time domain reflectometer signal 41, and which has traveled along the length of at least one of the multi-conductor or data transferring pair of conduits 23 or 24, and into a second, single ended, time domain reflectometer signal. The methodology 10 includes another step 90 of supplying the second, single ended, time domain reflectometer signal to the time domain reflectometer 11 for display 91 (FIG. 1). The method 10 includes another step 100 of numerically and/or graphically analyzing the second, single ended, time domain reflectometer signal 80 which was previously converted from the first differential time domain reflectometer signal by one of the high frequency balun coil 53 or 54, respectively. The method 10 includes a final step 110 of identifying, by means of the numerical and/or graphical analysis, an operational condition of the multi-conductor or data transfer cable 20.

With regard to the step 100 of numerically and/or graphically analyzing the received, single ended time domain reflectometer signals 80, and which were previously received from each of the two multi-conductor or data transferring pair of conduits 23 and 24, respectively, this step is selected from the group comprising, comparatively analyzing the previously electronically stored single ended, time domain reflectometer signals to a previously electronically stored template (not shown), and which is specific to the multi-conductor or data transfer cable 20 which is undergoing a test for the detection of a possible electrical fault; and/or comparatively analyzing a previous electronically stored, and chronologically older, single ended, time domain reflectometer signals 80 which were secured at a previous time, and when the same multi-conductor or data transfer cable 20 which is currently undergoing the test for the detection of a possible electrical fault, was operating in a satisfactory manner.

Therefore it will be seen that the present invention 10 provides a convenient means for readily detecting an operational condition of a multi-conductor cable 20 in a manner which rivals that produced by prior art devices, but which was not possible, heretofore by utilizing a time domain reflectometer 11, and which solely generated a single end time domain reflectometer signal. The present method 10 is easy to employ, can be utilized in various operational environments which are not easily accessed using the prior art time domain reflectometers that have solely generated differential signals heretofore; produces information which is immediately usable for the repair and restoration of digital systems which are electrically coupled to lengthy multi-conductor cables and which are similar to that produced by prior art devices, and which are further incorporated into very complex installations, and further provides a convenient, and cost effective means whereby maintenance personnel may precisely identify, along the length of a multi-conductor or data transfer cable, a location where an electrical fault or other undesirable operational condition exists so that this undesirable fault or condition can be readily remedied.

In compliance with the statute the invention has been described in language more or less specific as to structural and methodical features. It is to be understood, however, that the invention is not limited to the specific features shown and described since the means herein disclosed comprise preferred forms of putting the invention into effect. The invention is, therefore, claimed in any of its forms or modifications within the proper scope of the appended claims appropriately interpreted in accordance with the doctrine of equivalence.

We claim:

1. A method for detecting an unknown operational condition of a multi-conductor cable, comprising:
providing the unknown, multi-conductor cable having a given length dimension, and which further encloses at least one pair of conductors;
generating a first, single ended, time domain reflectometer signal;
processing the first, single ended, time domain reflectometer signal so as to generate a first, differential time domain reflectometer signal, and supplying the first, differential time domain reflectometer signal to the at least one pair of conductors for travel along the length of the unknown multi-conductor cable;

receiving the first, differential time domain reflectometer signal which has traveled along the length of the at least one pair of conductors;

converting the received first, differential time domain reflectometer signal which has traveled along the length of the multi-conductor cable into a second, single ended, time domain reflectometer signal;

numerically or graphically analyzing the received, second, single ended, time domain reflectometer signal; and identifying, by means of the numerical or graphical analysis, an operational condition of the multi-conductor cable.

2. A method as claimed in claim 1, and wherein the step of providing the unknown multi-conductor cable further comprises enclosing two or more pairs of conductors within the unknown multi-conductor cable.

3. A method as claimed in claim 2, and wherein the step of generating the first, single ended, time domain reflectometer signal includes the step of providing a single channel, time domain reflectometer, and selectively energizing the single channel, time domain reflectometer to generate the first, single ended, time domain reflectometer signal.

4. A method as claimed in claim 3, and wherein the step of processing the first, single ended, time domain reflectometer signal further comprises:

providing a high frequency balun coil, and electrically coupling the high frequency balun coil to the pair of conductors, and in signal receiving relation relative to the first, single ended, time domain reflectometer signal.

5. A method as claimed in claim 4, and wherein the steps of receiving the first, differential time domain reflectometer signal which has traveled along the at least one pair of conductors; and converting the received first differential time domain reflectometer signal into the second, single ended, time domain reflectometer is achieved by the high frequency balun coil.

6. A method as claimed in claim 5, and after the step of converting the received first, differential time domain reflectometer signal which has traveled along the length of the multi-conductor cable into the second, single ended, time domain reflectometer signal, and before the step of numerically or graphically analyzing the received, second, single ended, time domain reflectometer signal, the method further comprises:

supplying the second, single ended, time domain reflectometer signal to the time domain reflectometer; and displaying the second, single ended, time domain reflectometer signal by means of the time domain reflectometer.

7. A method as claimed in claim 6, and further comprising:

receiving, and electronically storing, for later use, the second, single ended, time domain reflectometer signals with the time domain reflectometer; and utilizing the previously electronically stored second, single ended, time domain reflectometer signals to determine the operational condition of the multi-conductor cable.

8. A method as claimed in claim 6, and wherein the step of providing the high frequency balun coil further comprises:

providing plural high frequency balun coils which are individually electrically coupled to each of two or more pair of conductors, and wherein each high frequency balun coil has a primary side electrical input, and a pair of secondary side electrical outputs, and wherein a first electrical output is electrically coupled to one of the conductors which make up one of the pair of conductors, and a second electrical output is electrically coupled to the other of the conductors which make up the pair of conductors.

9. A method as claimed in claim 8, and wherein the step of providing the single channel, time domain reflectometer further comprises, delivering the first, single ended time domain reflectometer signal to the primary side electrical input of one of the high frequency balun coils.

10. A method as claimed in claim 9, and wherein the step of providing high frequency balun coils further comprises:

providing a signal processing assembly which is electrically coupled with the single channel, time domain reflectometer, and which further receives the first, single ended time domain reflectometer signal, and further encloses the respective high frequency balun coils; and providing an electrical switch which is electrically coupled to the signal processing assembly, and which further permits a user to selectively, electrically deliver the generated first, single ended, time domain reflectometer signal solely to the primary side electrical input of one of the high frequency balun coils which are electrically coupled with one of the two or more pairs of conductors.

11. A method as claimed in claim 10, and wherein the step of identifying by means of the numerical or graphical analysis, an operational condition of the multi-conductor cable further comprises:

identifying, and then locating one or more electrical faults along the length of the multi-conductor cable; identifying the location and operational condition of one or more electrical couplings which have been made to the multi-conductor cable; identifying the operational quality of the multi-conductor cable, and all electrical couplers which are electrically joined to the multi-conductor cable; and/or verifying an electrical termination of each of the pairs of conductors within the multi-conductor cable.

12. A method as claimed in claim 11, and wherein before the step of numerically analyzing the received, second, single ended, time domain reflectometer signal, the method further comprises:

providing a non-faulted, multi-conductor cable having a given length dimension which is the same as the previously mentioned multi-conductor cable, and which further encloses two pairs of conductors;

generating a second, differential time domain reflectometer signal, and selectively supplying the generated second, differential time domain reflectometer signal to each of the pair of conductors which are enclosed within the non-faulted, multi-conductor cable; and receiving, and electronically storing, for later use by the time domain reflectometer, a third, single ended, time domain reflectometer signal which has been generated by at least one of the high frequency balun coils from the second differential time domain reflectometer signal which has previously traveled along each of the pair of conductors which are enclosed within the non-faulted, multi-conductor cable.

13. A method as claimed in claim 12, and wherein the step of numerically or graphically analyzing the received, and previously electronically stored, second, single ended, time domain reflectometer signals further comprises:

electronically comparing the respective single ended, time domain reflectometer signals to identify an operational condition of the unknown multi-conductor cable.

14. A method as claimed in claim 13, and wherein the step of numerically or graphically analyzing the received, single ended, time domain reflectometer signals, and which were previously received from each of the two pairs of conductors, is selected from the group comprising, comparatively analyzing the previously electronically stored, single ended, time domain reflectometer signals to a previously electronically stored template which is specific to the multi-conductor cable which is undergoing a test for the detection of a possible electrical fault; and/or comparatively analyzing a previous electronically stored, and chronologically older, single ended, time domain reflectometer signals which were secured at a previous time when the multi-conductor cable which is currently undergoing the test for the detection of a possible electrical fault, was operating in a satisfactory manner.

15. A method for detecting an operational condition of an unknown multi-conductor cable, comprising:
providing the unknown multi-conductor cable having a given length dimension, and which further encloses at least one pair of conductors;
providing a high frequency balun coil, and electrically coupling the high frequency balun coil to the pair of conductors;
generating a first, single ended, time domain reflectometer signal with a time domain reflectometer, and supplying the first, single ended, time domain reflectometer signal to the high frequency balun coil;
generating a first, differential time domain reflectometer signal with the high frequency balun coil which has previously received the first, single ended, time domain reflectometer signal, and supplying the first, differential time domain reflectometer signal to the at least one pair of conductors for travel along the length of the unknown multi-conductor cable;
receiving, with the high frequency balun coil, the first, differential time domain reflectometer signal which has previously traveled along the length of the at least one pair of conductors;
converting, with the high frequency balun coil, the first differential time domain reflectometer signal which has traveled along the length of the at least one pair of conductors into a second, single ended, time domain reflectometer signal;
supplying the second, single ended, time domain reflectometer signal to the time domain reflectometer for display;
numerically and/or graphically analyzing the second, single ended, time domain reflectometer signal which was previously converted from the first, differential time domain reflectometer signal by the high frequency balun coil; and
identifying, by means of the numerical and/or graphical analysis, an operational condition of the multi-conductor cable.

16. A method for detecting an operational condition of an unknown multi-conductor cable, comprising:
providing a non-faulted, multi-conductor cable having a given length, and which further encloses two pairs of conductors;
generating a first, differential time domain reflectometer signal, and selectively supplying the generated, first, differential time domain reflectometer signal to each of the pair of conductors which are enclosed within the non-faulted, multi-conductor cable;
converting the first, differential time domain reflectometer signal which has traveled along each of the pair of conductors which are enclosed within the non-faulted, multi-conductor cable into a single ended, time domain reflectometer signal;
providing the unknown multi-conductor cable having a similar length dimension as the non-faulted, multi-conductor cable, and which further encloses two pairs of conductors;
generating a second, differential time domain reflectometer signal, and selectively supplying the generated second, differential time domain reflectometer signal to each of the pair of conductors which are enclosed within the unknown multi-conductor cable;
converting the second, differential time domain reflectometer signal which has traveled along each of the pair of conductors which are enclosed within the unknown multi-conductor cable into another, single ended, time domain reflectometer signal;
numerically and/or graphically analyzing the respective single ended, time domain reflectometer signals which were obtained from the respective two pairs of conductors, and which are each enclosed within the non-faulted, and unknown multi-conductor cables, respectively; and
identifying an operational condition of the unknown, multi-conductor cable by conducting the numerical and/or graphical analysis of the respective single ended, time domain reflectometer signals which have been obtained.

17. A method as claimed in claim 16, and further comprising:
providing three or more pairs of conductors within the non-faulted, multi-conductor cable.

18. A method as claimed in claim 16, and further comprising:
providing a single channel, time domain reflectometer, and electrically coupling the time domain reflectometer to a first end of the non-faulted multi-conductor cable, and selectively energizing the time domain reflectometer so as to generate a first, single ended, time domain reflectometer signal.

19. A method as claimed in claim 18, and further comprising:
providing a signal processing assembly having one or more high frequency balun coils which are individually coupled to each pair of conductors, and are further coupled in an electrical signal receiving relationship relative to the first, single ended, time domain reflectometer signal, and generating, with each high frequency balun coil, a first, differential time domain reflectometer signal output from the first, single ended, time domain reflectometer signal, and which is further selectively supplied to one of the two pairs of conductors.

20. A method as claimed in claim 19, and further comprising:
providing an electrical switch which is electrically coupled to the signal processing assembly, and which further permits a user to selectively, electrically deliver the generated first, differential time domain reflectometer signal solely to one of the high frequency balun coils which are electrically coupled with one of the two pairs of conductors.

21. A method as claimed in claim 20, and wherein the step of providing the signal processing assembly further comprises:
- providing a housing and enclosing each balun coil within the housing, and further electrically coupling the time domain reflectometer to each of the balun coils by means of the electrical switch; and
- providing an electrical coupler on the housing, and which is further electrically coupled with each of the balun coils, and wherein the electrical coupler is further operable to releasably, electrically couple with one of the multi-conductor cables.

22. A method as claimed in claim 21, and wherein the first and second differential time domain reflectometer signals, upon being delivered into one of the pair of conductors of the respective non-faulted or unknown multi-conductor cables travels along from a first end of one of the of conductors, and is reflected from a second end thereof, and wherein the first and second, differential time domain reflectometer signals are selectively introduced into each of the pair of conductors to verify the electrical termination of the second end of the non-faulted or unknown, multi-conductor cables; to identify an electrical fault present in the respective pairs of conductors of the non-faulted, or unknown multi-conductor cables; to measure an electrical impedance of each of the pair of conductors of the non-faulted, or unknown multi-conductor cables; and/or to inspect at least one electrical connection which is made to the non-faulted, or unknown multi-conductor cables.

* * * * *